(12) United States Patent
Liu et al.

(10) Patent No.: US 9,520,420 B2
(45) Date of Patent: Dec. 13, 2016

(54) METHOD FOR MANUFACTURING ARRAY SUBSTRATE, ARRAY SUBSTRATE, AND DISPLAY DEVICE

(71) Applicant: BOE TECHNOLOGY GROUP CO., LTD., Beijing (CN)

(72) Inventors: Zheng Liu, Beijing (CN); Jangsoon Im, Beijing (CN); Zuqiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/402,532

(22) PCT Filed: Dec. 16, 2013

(86) PCT No.: PCT/CN2013/089535
§ 371 (c)(1),
(2) Date: Nov. 20, 2014

(87) PCT Pub. No.: WO2015/007053
PCT Pub. Date: Jan. 22, 2015

(65) Prior Publication Data
US 2015/0340389 A1    Nov. 26, 2015

(30) Foreign Application Priority Data
Jul. 17, 2013   (CN) .......................... 2013 1 0300658

(51) Int. Cl.
*H01L 27/12*    (2006.01)

(52) U.S. Cl.
CPC ....... *H01L 27/1274* (2013.01); *H01L 27/1255* (2013.01); *H01L 27/1262* (2013.01)

(58) Field of Classification Search
CPC ........... H01L 27/1255; H01L 21/02356; H01L 21/32155; H01L 27/1274
See application file for complete search history.

(56) References Cited

U.S. PATENT DOCUMENTS

| 4,904,611 A * | 2/1990 | Chiang ............... H01L 21/2022 148/DIG. 132 |
| 2003/0042559 A1* | 3/2003 | Takemura ........... H01L 27/1248 257/408 |

(Continued)

FOREIGN PATENT DOCUMENTS

| CN | 1549033 A | 11/2004 |
| CN | 1710469 A | 12/2005 |

(Continued)

OTHER PUBLICATIONS

Office Action issued in Chinese Application No. 201310300658.X dated Oct. 30, 2014 (Oct. 30, 2014).

(Continued)

*Primary Examiner* — Daniel Whalen
*Assistant Examiner* — Suberr Chi
(74) *Attorney, Agent, or Firm* — Nath, Goldberg & Meyer; Joshua B. Goldberg

(57) ABSTRACT

The present invention provides a method for manufacturing an array substrate, an array substrate, and a display device. The method for manufacturing an array substrate, including a step of forming a thin film transistor and a storage capacitor on a substrate, the thin film transistor including a gate, a source, and a drain, and the storage capacitor including a first pole plate and a second pole plate, wherein, arranging the source, the drain, and the first pole plate in a single layer through implanting dopant ions into an amorphous silicon layer formed on the substrate by one ion-implantation process, and through crystallizing an amorphous silicon material forming the amorphous silicon layer and activating the dopant ions by a laser irradiation process. Accordingly, process steps are simplified and a process cost is reduced greatly, and the performances of the array substrate and the display device are increased.

12 Claims, 3 Drawing Sheets

(56) References Cited

U.S. PATENT DOCUMENTS

| | | | | |
|---|---|---|---|---|
| 2003/0224570 A1* | 12/2003 | Shih | ............... | H01L 27/1255 438/253 |
| 2005/0285197 A1* | 12/2005 | Park | ............... | H01L 27/1255 257/347 |
| 2010/0001284 A1* | 1/2010 | Cho | ............... | H01L 27/1251 257/72 |
| 2011/0240999 A1* | 10/2011 | You | ............... | H01L 27/1288 257/59 |
| 2016/0043114 A1* | 2/2016 | Mao | ............ | H01L 29/66757 257/72 |

FOREIGN PATENT DOCUMENTS

| | | |
|---|---|---|
| CN | 1716552 A | 1/2006 |
| CN | 103107095 A | 5/2013 |
| CN | 103390592 A | 11/2013 |

OTHER PUBLICATIONS

Office Action issued in Chinese Application No. 201310300658.X dated Mar. 19, 2015 (Mar. 19, 2015).

Search Report issued in International Application No. PCT/CN2013/089535, fourteen (14) pages.

\* cited by examiner

METHOD FOR MANUFACTURING ARRAY SUBSTRATE, ARRAY SUBSTRATE, AND DISPLAY DEVICE

FIELD OF THE INVENTION

The present invention belongs to the field of display technology, and relates to a method for manufacturing an array substrate, an array substrate, and a display device.

BACKGROUND OF THE INVENTION

With the development of display technology, a demand for display quality increases gradually. A flat panel display device with high image quality and high resolution becomes more and more popular, and attracts the attention of a manufacturer of display panel increasingly. Currently, the most common flat panel display devices include a plasma display panel (PDP), a liquid crystal display (LCD), and an organic light-emitting diode (OLED) display device.

Currently, a thin film transistor (TFT) is a main driving element in a liquid crystal display device and in an active matrix organic light-emitting diode (AMOLED) display device, and directly relates to a development direction of a flat panel display device with high performance. Thin film transistors have a plurality of structures, and there are a plurality of materials for manufacturing the corresponding structures, among the plurality of materials, low-temperature polysilicon is preferable. Since an arrangement of atoms of low-temperature polysilicon is regular, the carrier mobility thereof is high (10-300 $cm^2/Vs$). For a voltage drive type liquid crystal display device, a polysilicon thin film transistor with a smaller area can achieve deflection driving of liquid crystal molecules because it has a high mobility, which reduces a volume occupied by the thin film transistor largely, increases a light transmission area, and results in a higher brightness and a higher resolution. For a current drive type active matrix organic light-emitting diode display device, a polysilicon thin film transistor can meet a requirement of driving current better. Further, by using a material of low-temperature polysilicon, a driving integrated circuit (IC) may be integrated onto an array substrate, or even be manufactured as a system on glass (SOG), causing the array substrate to have advantages such as a smaller weight, a smaller thickness, a lower power consumption.

Although a low-temperature polysilicon thin film transistor has the above advantages, to achieve a continuous driving capacity in an array substrate of low-temperature polysilicon thin film transistor, it is necessary to provide a storage capacitor (Cs) at the same time. Especially in a display panel with high resolution, it is generally necessary to provide a Cs with large capacity to a low-temperature polysilicon thin film transistor for meeting driving requirements. Currently, in a method for manufacturing a low-temperature polysilicon thin film transistor and a storage capacitor in an array substrate, two ion-implantation processes must be employed due to different ion-implantation regions. Specifically, using a photoresist mask formed of a photoresist, a lower electrode of a storage capacitor is formed by one ion-implantation process. Then, using a mask formed of a material which is used to form the metal layer of a gate, a source and a drain is formed by one ion-implantation process. Furthermore, an activation process is performed on dopant ions implanted by the ion-implantation processes generally by using a high-temperature furnace annealing method or a rapid thermal annealing method. However, it takes a long time (several hours) to perform a heating process and a cooling process when the high-temperature furnace annealing method is used, causing a long process time. It also needs an additional special rapid thermal annealing apparatus to employ the rapid thermal annealing method, causing the costs of equipment, maintenance, personnel, etc to increase.

It can be seen that, in the existing method for forming a low-temperature polysilicon thin film transistor and a storage capacitor in an array substrate, it is difficult to achieve mass production of array substrates of low-temperature polysilicon thin film transistor, due to not only its complex process and long process time but also the requirement of many expensive apparatuses and the increased production cost.

SUMMARY OF THE INVENTION

In view of the above defects in the prior art, the technical problem to be solved by the present invention is to provide a method for manufacturing an array substrate, an array substrate, and a display device. The method for manufacturing an array substrate can simplify process steps and reduce a process cost greatly, and increase the performance of the array substrate and the performance of the display device including the array substrate at the same time.

A technical solution for solving the technical problem of the present invention is to provide a method for manufacturing an array substrate. The method includes a step of forming a thin film transistor and a storage capacitor on a substrate, the thin film transistor including a gate, a source, and a drain, and the storage capacitor including a first pole plate and a second pole plate, wherein, arranging the source, the drain, and the first pole plate in a single layer through implanting dopant ions into an amorphous silicon layer formed on the substrate by one ion-implantation process, and through crystallizing an amorphous silicon material forming the amorphous silicon layer and activating the dopant ions by a laser irradiation process.

Preferably, the step of forming a thin film transistor and a storage capacitor on a substrate includes the following steps:

step S10: forming a buffer layer on the substrate;

step S11: forming the amorphous silicon layer on the buffer layer, and performing a patterning process on the amorphous silicon layer to form a pattern including an amorphous silicon island;

step S12: on the substrate subjected to the step S11, forming a photoresist mask by using a photoresist, setting a to-be-doped region in the amorphous silicon island, and implanting the dopant ions into the to-be-doped region by the one ion-implantation process, wherein, the to-be-doped region includes a source region to be formed into the source, a drain region to be formed into the drain, and a pole plate region to be formed into the first pole plate;

step S13: on the substrate subjected to the step S12, irradiating the amorphous silicon island by the laser irradiation process to convert the amorphous silicon island into a polysilicon island and activate the dopant ions in the source, the drain, and the first pole plate; and step S14: on the substrate subjected to the step S13, forming a pattern including a gate insulating layer, the gate, and the second pole plate, so that the gate at least partially overlaps the source and the drain in an orthogonal projection direction, and the second pole plate at least partially overlaps the first pole plate in the orthogonal projection direction.

Preferably, the step of forming a thin film transistor and a storage capacitor on a substrate includes the following steps:

step S20: forming a buffer layer on the substrate;

step S21: forming a pattern including the gate, the second pole plate, and a gate insulating layer on the buffer layer;

step S22: forming the amorphous silicon layer on the substrate subjected to the step S21, and performing a patterning process on the amorphous silicon layer to form a pattern including an amorphous silicon island;

step S23: on the substrate subjected to the step S22, forming a photoresist mask by using a photoresist, setting a to-be-doped region in the amorphous silicon island, and implanting the dopant ions into the to-be-doped region by the one ion-implantation process, wherein, the to-be-doped region includes a source region to be formed into the source, a drain region to be formed into the drain, and a pole plate region to be formed into the first pole plate, the gate at least partially overlaps the source and the drain in an orthogonal projection direction, and the second pole plate at least partially overlaps the first pole plate in the orthogonal projection direction; and step S24: on the substrate subjected to the step S23, irradiating the amorphous silicon island by the laser irradiation process to convert the amorphous silicon island into a polysilicon island and activate the dopant ions in the source, the drain, and the first pole plate.

Further preferably, the step of forming a photoresist mask by using a photoresist, setting a to-be-doped region in the amorphous silicon island, and implanting the dopant ions into the to-be-doped region by the one ion-implantation process include the following steps:

step S30: forming a layer of photoresist on the substrate on which the pattern including the amorphous silicon island is formed;

step S31: exposing the photoresist by using a mask plate and developing the photoresist, so that portions of the photoresist which correspond to the source region, the drain region, and the pole plate region are removed completely, and other portion of the photoresist is reserved completely;

step S32: implanting the dopant ions into the source region, the drain region, and the pole plate region by the one ion-implantation process; and step S33: stripping off remaining photoresist.

Preferably, the ion-implantation process includes an ion-implantation process with a mass analyzer, an ion cloud type implantation process without a mass analyzer, a plasma implantation process, or a solid-state diffusion implantation process, wherein, an implantation medium is a gas including a boron element and/or a phosphorus element, an implantation energy is in a range of 10-200 keV, and an implantation dose is in a range of $1\times10^{11}$-$1\times10^{20}$ atoms/cm$^3$.

Preferably, the laser irradiation process is an excimer laser process, the laser irradiation process includes two laser irradiation treatments, a first laser irradiation treatment causes the amorphous silicon island to be crystallized and converted into a polysilicon island, a second laser irradiation treatment actives the dopant ions implanted into the polysilicon island by the ion-implantation process to active the dopant ions in the source, the drain, and the first pole plate.

Preferably, a laser used in the excimer laser process includes an ArF laser, a KrF laser, or an XeCl laser, the ArF laser has a wavelength of 193 nm, the KrF laser has a wavelength of 248 nm, and the XeCl laser has a wavelength of 308 nm, and the ArF laser, the KrF laser, and the XeCl laser have a pulse width range of 10-50 ns.

Further preferably, the method further includes the following step:

forming an interlayer insulating layer and a pattern including an extraction electrode on the substrate on which the thin film transistor and the storage capacitor are formed, so that the extraction electrode includes a first electrode and a second electrode, the interlayer insulating layer are provided with a first via and a second via at regions which correspond to the source and the drain respectively, the source is electrically connected to the first electrode through the first via, and the drain is electrically connected to the second electrode through the second via.

There is also provided an array substrate formed by using the above method for manufacturing an array substrate.

There is also provided a display device including the above array substrate.

The advantageous effects of the present invention are as follows: in the method for manufacturing an array substrate according to the present invention, a source, a drain, and a first pole plate are formed by one ion-implantation process, and two excimer laser irradiation treatments are performed by using an excimer laser apparatus, which plays the roles of crystallizing an amorphous silicon material and activating dopant ions at the same time. Thus, process steps are simplified and a process cost is reduced greatly, which enables mass production of array substrates of low-temperature polysilicon thin film transistor to be achieved easily. Furthermore, the performance of an array substrate and the performance of a display device including the array substrate are increased at the same time.

BRIEF DESCRIPTION OF THE DRAWINGS

FIGS. 2A to 2F are sectional views of structures obtained in respective steps of the method for manufacturing an array substrate according to Embodiment 1; wherein FIG. 2A is a sectional view showing formation of a pattern including a buffer layer;

FIG. 2B is a sectional view showing formation of a pattern including an amorphous silicon island;

FIG. 2C is a schematic diagram showing formation of a pattern including a photoresist mask and implementation of an ion-implantation process;

FIG. 2D is a schematic diagram showing implementation of an excimer laser process;

FIG. 2E is a sectional view showing formation of a pattern including a gate insulating layer, a gate, and a second pole plate;

FIG. 2F is a sectional view showing formation of an interlayer insulating layer and a pattern including an extraction electrode.

DETAILED DESCRIPTION OF THE EMBODIMENTS

To make a person skilled in the art better understand technical solutions of the present invention, a method for manufacturing an array substrate, an array substrate, and a display device according to the present invention will be further described in detail with reference to the drawings and embodiments.

There is provided a method for manufacturing an array substrate, including a step of forming a thin film transistor and a storage capacitor on a substrate, the thin film transistor including a gate, a source, and a drain, and the storage capacitor including a first pole plate and a second pole plate, wherein, arranging the source, the drain, and the first pole plate in a single layer through implanting dopant ions into an amorphous silicon layer formed on the substrate by one ion-implantation process, and through crystallizing an amorphous silicon material forming the amorphous silicon layer and activating the dopant ions by a laser irradiation process.

There is also provided an array substrate formed by using the above method for manufacturing an array substrate.

There is also provided a display device including the above array substrate.

Embodiment 1

There is provided a method for manufacturing an array substrate, including a step of forming a thin film transistor and a storage capacitor on a substrate, the thin film transistor including a gate, a source, and a drain, and the storage capacitor including a first pole plate and a second pole plate. Wherein, the source, the drain, and the first pole plate are arranged in a single layer through implanting dopant ions into an amorphous silicon layer formed on the substrate by one ion-implantation process, and through crystallizing an amorphous silicon material forming the amorphous silicon layer and activating the dopant ions by a laser irradiation process.

Figure 1:
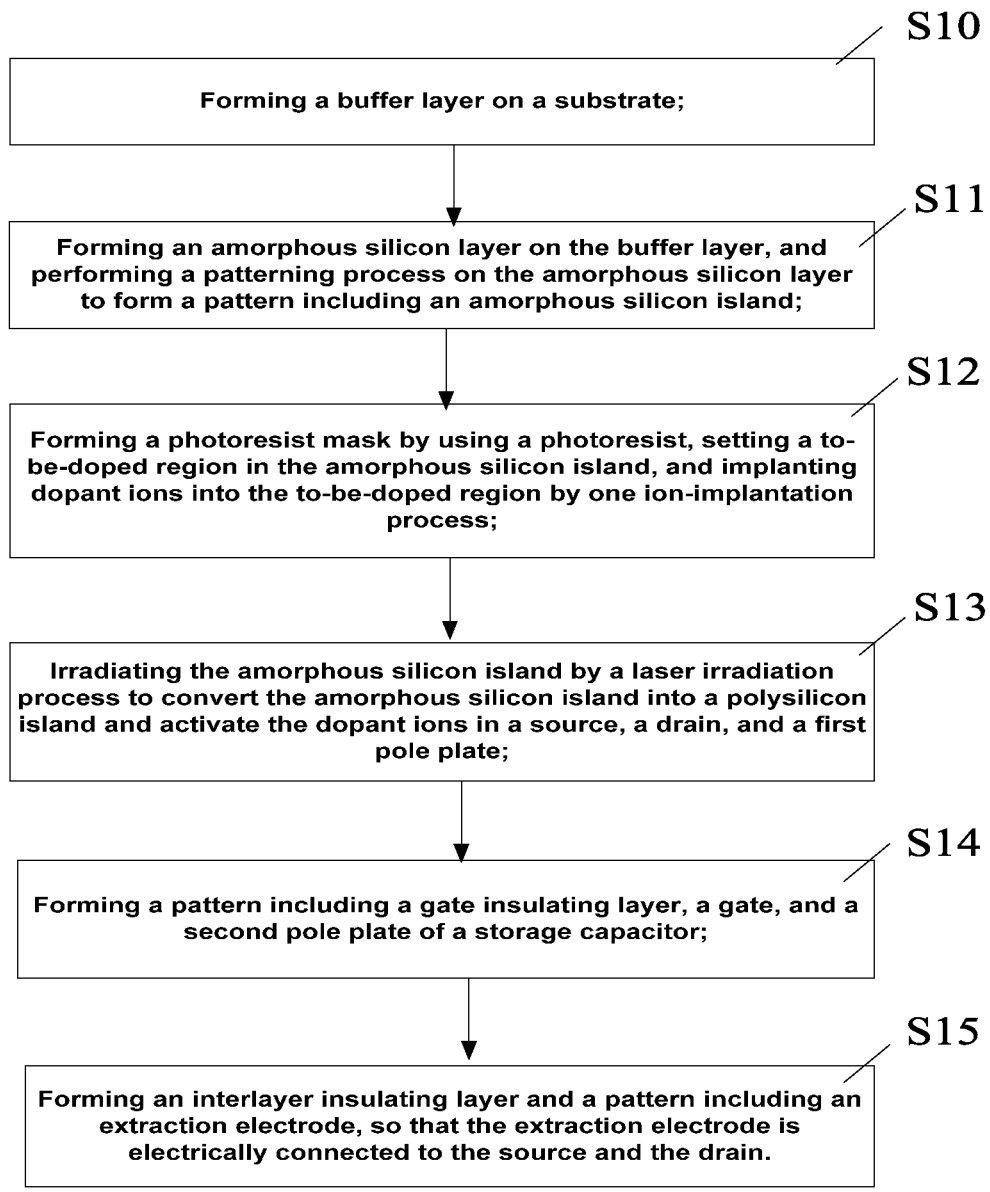
FIG. 1 is a flow chart showing the method for manufacturing an array substrate according to Embodiment 1 of the present invention.

With reference to FIG. 1, the procedure of the method for manufacturing an array substrate according to the present embodiment specifically includes the following steps:

Step S10: forming a buffer layer on the substrate.

Figure 2A:
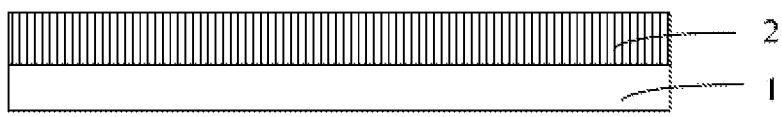

As shown in FIG. 2A, in the present step, a buffer layer 2 is formed on a substrate 1 which is pre-cleaned, by plasma enhanced chemical vapor deposition (PECVD), low pressure chemical vapor deposition (LPCVD), atmospheric pressure chemical vapor deposition (APCVD), electron cyclotron resonance chemical vapor deposition (ECR-CVD), or sputtering. The buffer layer 2 may be a single layer of silicon oxide or a single layer of silicon nitride, or may be a lamination layer of the both. A thickness of the buffer layer 2 is in a range of 300 Å-10000 Å, and preferably in a range of 500 Å-4000 Å. A deposition temperature of the buffer layer 2 is less than or equal to 600° C.

Wherein, the buffer layer 2 is used to block an impurity contained in the substrate 1 from diffusing into an active layer of a thin film transistor, preventing influence on characteristics such as a threshold voltage and a leakage current of the thin film transistor. In addition to introduction of the buffer layer 2, preferably, the substrate 1 is formed of an alkali-free glass, since a traditional alkali glass has a high content of metal impurities such as aluminum, barium, sodium, easily resulting in diffusion of metal impurities in a high temperature treatment process.

Step S11: forming the amorphous silicon layer on the buffer layer, and performing a patterning process on the amorphous silicon layer to form a pattern including an amorphous silicon island.

Figure 2B:
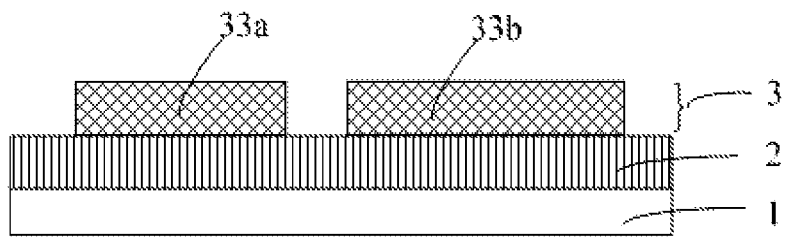

As shown in FIG. 2B, in the present step, an amorphous silicon material is deposited on the buffer layer 2 by a deposition process to form an amorphous silicon layer 3. The deposition process includes plasma enhanced chemical vapor deposition or low pressure chemical vapor deposition, and a deposition temperature thereof is less than or equal to 600° C. A thickness of the amorphous silicon layer 3 is in a range of 100 Å-3000 Å, and preferably in a range of 500 Å-1000 Å.

Specifically, a pattern including an amorphous silicon island is formed in the amorphous silicon layer 3 by using a patterning process. The amorphous silicon island includes an active layer silicon island 33a and a pole plate silicon island 33b. Wherein, the patterning process may only include a lithography process or may include a lithography process and an etching step, meanwhile, may further include other process for forming a predetermined pattern such as a printing process, an ink-jet process. The lithography process refers to a process of forming a pattern by using a photoresist, a mask plate, an exposure machine, and the like, including process procedures such as film formation, exposure, and development. A corresponding patterning process may be selected according to the structure formed in the present invention.

In the present embodiment, the patterning process includes forming a layer of photoresist (also referred to as photoresist material) on the amorphous silicon layer 3, performing exposure and development on the photoresist to form a photoresist mask, and then performing a dry etching process on the amorphous silicon layer 3 to form a pattern including the active layer silicon island 33a and the pole plate silicon island 33b. Wherein, a region of the active layer silicon island 33a is used to form an active layer of the thin film transistor and further form the source and the drain at two opposite ends of the active layer, and a region of the pole plate silicon island 33b is used to form a pole plate of the storage capacitor. In the dry etching process, a gas including a fluorine element or a chlorine element, such as $SF_6$, $CF_4$, $CHF_3$, $CCl_2F_2$, or a mixed gas of the previous gas and $O_2$ may be used as an etching medium. Etching is performed by using a reactive ion etching method, a plasma etching method, or an inductively coupled plasma etching method.

Step S12: on the substrate subjected to the step S11, forming a photoresist mask by using a photoresist, setting a to-be-doped region in the amorphous silicon island, and implanting the dopant ions into the to-be-doped region by the one ion-implantation process. Wherein, the to-be-doped region includes a source region to be formed into the source, a drain region to be formed into the drain, and a pole plate region to be formed into the first pole plate.

Figure 2C:
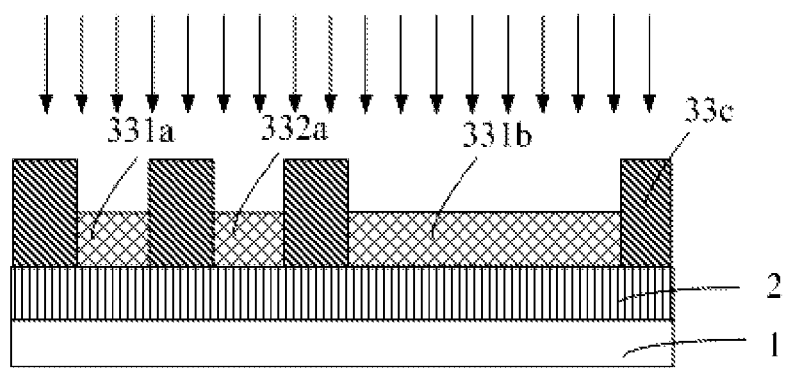

As shown in FIG. 2C, the present step includes forming a photoresist mask 33c with a photoresist by using a lithography process, setting the to-be-doped region in the amorphous silicon island, and implanting the dopant ions into the to-be-doped region by the one ion-implantation process. Specifically, the following steps are included:

Step S30: forming a layer of photoresist on the substrate on which the pattern including the amorphous silicon island is formed.

Step S31: exposing the photoresist by using a mask plate and developing the photoresist, so that portions of the photoresist which correspond to the source region, the drain region, and the pole plate region are removed completely, and other portion of the photoresist is reserved completely.

In the present step, the to-be-doped region is set by the photoresist mask removed by exposure and development. Wherein, two opposite ends of the active layer silicon island 33a are set as a source region 331a to be formed into the source and a drain region 332a to be formed into the drain, and the pole plate silicon island 33b is set as a pole plate region 331b to be formed into the first pole plate.

Step S32: implanting the dopant ions into the source region 331a, the drain region 332a, and the pole plate region 331b by the one ion-implantation process.

Figure 2D:
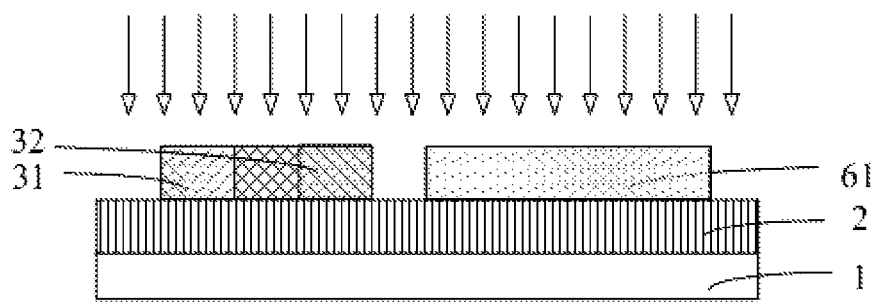

As shown in FIG. 2C, in the present step, the ion-implantation process is performed on the source region 331a, the drain region 332a, and the pole plate region 331b at the same time. The ion-implantation process includes an ion-implantation process with a mass analyzer, an ion cloud type implantation process without a mass analyzer, a plasma implantation process, or a solid-state diffusion implantation process. In the present embodiment, the ion cloud type implantation process is preferably used. With reference to FIG. 2D, a heavy dose ion implantation is performed on the source region 331a, the drain region 332a, and the pole plate region 331b to form a source 31, a drain 32, and a first pole plate 61 of the storage capacitor. An undoped region between the source region 331a and the drain region 332a constitutes a semiconductor region corresponding to a gap between the source 31 and the drain 32 when a turn-on voltage is applied to the gate.

An implantation medium is a gas including a boron element and/or a phosphorus element to form a P type or N type thin film transistor according to a design requirement. Preferably, a mixed gas including a boron element (e.g., $B_2H_6/H_2$, the volume ratio thereof is within 5%-15%) is used as the implantation medium. An implantation energy is in a range of 10-200 keV, and preferably in a range of 40-100 keV. An implantation dose is in a range of $1\times10^{11}$-$1\times10^{20}$ atoms/cm$^3$, and preferably in a range of $1\times10^{13}$-$8\times10^{15}$ atoms/cm$^3$. Alternatively, a mixed gas including a phosphorus element (e.g., $PH_3/H_2$) may be used as the implantation medium, and the implantation energy and the implantation dose are similar with those of the above $B_2H_6/H_2$, detailed description thereof being omitted.

Step S33: stripping off remaining photoresist.

In the present step, the remaining photoresist (or photoresist mask) is removed by using an ashing process or a strip-off process.

In the present embodiment, the source, the drain, and the first pole plate (i.e., a lower electrode) of the storage capacitor is formed at the same time by one ion-implantation process. However, in the prior art, in a manufacturing process of a low-temperature polysilicon thin film transistor, firstly, using a photoresist mask formed of a photoresist, a lower electrode of a storage capacitor is formed by one ion-implantation process; then, using a mask formed of a material which is used to form the metal layer of a gate, a source and a drain is formed by one ion-implantation process. That is, two ion-implantation processes are required to form a source and a drain of a thin film transistor as well as a lower pole plate of a storage capacitor. In contrast, the present embodiment saves one ion-implantation process, shortens a process time, and reduces a production cost.

Step S13: on the substrate subjected to the step S12, irradiating the amorphous silicon island by the laser irradiation process to convert the amorphous silicon island into a polysilicon island and activate the dopant ions in the source, the drain, and the first pole plate.

As shown in FIG. 2D, in the present step, the laser irradiation process is an excimer laser process. The laser irradiation process includes two excimer laser irradiation treatments. A first laser irradiation treatment causes the amorphous silicon island to be crystallized and converted into a polysilicon island, and a second laser irradiation treatment actives the dopant ions implanted into the polysilicon island by the ion-implantation process to active the dopant ions in the source, the drain, and the first pole plate. A period of time for each excimer laser irradiation is a pulse width of a corresponding excimer laser apparatus, for example, 10-50 ns.

An excimer laser apparatus used in the excimer laser process includes an ArF laser, a KrF laser, or an XeCl laser. The ArF laser has a wavelength of 193 nm, the KrF laser has a wavelength of 248 nm, and the XeCl laser has a wavelength of 308 nm. The ArF laser, the KrF laser, and the XeCl laser have a pulse width range of 10-50 ns. In the present embodiment, the XeCl laser is preferably used since its laser wavelength is relatively long, its laser energy is implanted into the amorphous silicon island more deeply, and its crystallization effect and activation effect is better.

Wherein, when crystallization is performed by using the excimer laser process, a laser beam with high power is applied to an amorphous silicon island to be crystallized. Since an amorphous silicon material has a strong ultraviolet absorption capacity, the surface of the amorphous silicon island absorbs a lot of energy. Hot electron-hole pairs are excited in the amorphous silicon island by a laser pulse firstly, then the electron-hole pairs transfer energy to lattice atoms in a manner of non-radiative recombination, thereby realizing instant heating of the amorphous silicon. In this procedure, instant energy of the laser pulse is absorbed by the amorphous silicon and converted into phase change energy, and the amorphous silicon is melt and crystallized into polysilicon in a very short period of time, i.e., the amorphous silicon island is converted into a polysilicon island. It must be noted that, when the laser irradiation process is performed, it is possible to only irradiate the amorphous silicon island so that the amorphous silicon island is crystallized to form a polysilicon island, or an entire layer, where the amorphous silicon island is located, may be irradiated to simplify a process, which is not limited in the present invention, as long as the amorphous silicon island is crystallized to form a polysilion island by a laser irradiation process.

When the dopant ions are activated by using the excimer laser process, the laser irradiation treatment causes the polysilicon to melt and recrystallize, increasing the crystallite dimension. Thus, carrier mobility of a polysilicon thin film transistor is increased largely, so that a drive capability of the thin film transistor is increased, a volume thereof can be further reduced, facilitating manufacturing a display panel with high resolution. At the same time, a second excimer laser process also increases crystallization uniformity, and further causes the lattice of the polysilicon crystallized by the first excimer laser process to be more uniform. Thus, a problem that the lattice of the polysilicon is nonuniform and a threshold voltage of the thin film transistor changes greatly due to unstable laser energy is avoided. As a result, the stability of a performance of an array substrate is guaranteed, which facilitates manufacturing a display panel with large area.

In the prior art, in a manufacturing process of a low-temperature polysilicon thin film transistor, after an ion-implantation process, an activation process is generally performed on dopant ions implanted by the ion-implantation process by using a high-temperature furnace annealing process or a rapid thermal annealing (RTA) process. However, it takes a long time (several hours) to perform a heating process and a cooling process when the high-temperature furnace annealing is used, resulting in a long process time. It is necessary to provide an additional special rapid thermal annealing apparatus to employ the rapid thermal annealing process, causing the costs of equipment, maintenance, personnel, etc to increase.

In the present embodiment, an excimer laser apparatus is directly used to play the roles of crystallization (the first laser irradiation treatment) and activating dopant ions (the second laser irradiation treatment) at the same time. Thus, a long heating process and a long cooling process are not required, and a cost for process equipment is reduced. Furthermore, since excimer laser crystallization can cause the surface of the amorphous silicon island to instantly reach a high temperature of 1000° C. or more so as to be converted into a molten state in a very short period of time, there will be no excessive heat transferring to the substrate 1 (which is generally a glass substrate). Thus, the temperature of the substrate is guaranteed to be about 400° C. or less, and a problem that the substrate is deformed due to its high temperature in a general furnace annealing process can be avoided.

Step S14: on the substrate subjected to the step S13, forming a pattern including a gate insulating layer, the gate, and the second pole plate, so that the gate at least partially overlaps the source and the drain in an orthogonal projection direction, and the second pole plate at least partially overlaps the first pole plate in the orthogonal projection direction.

Figure 2E:
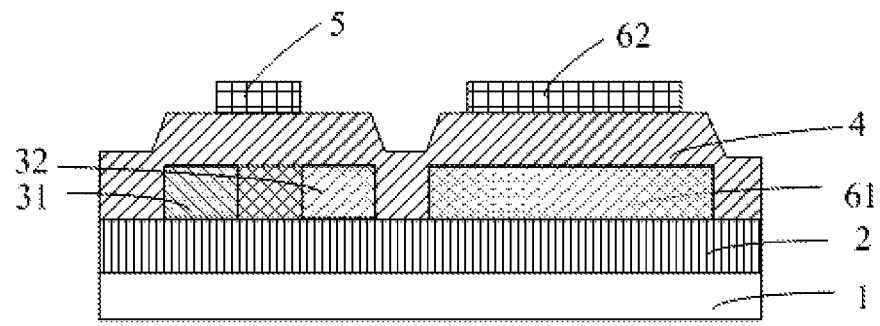

As shown in FIG. 2E, in the present step, a gate insulating layer 4 is formed on the source 31, the drain 32, and the first pole plate 61 by plasma enhanced chemical vapor deposition, low pressure chemical vapor deposition, atmospheric pressure chemical vapor deposition, or electron cyclotron resonance chemical vapor deposition, the deposition temperature thereof being less than or equal to 600° C. Then, a first metal layer is formed on the gate insulating layer 4 by sputtering, thermal evaporation, plasma enhanced chemical vapor deposition, low pressure chemical vapor deposition, atmospheric pressure chemical vapor deposition, or electron cyclotron resonance chemical vapor deposition, and a pattern including a gate 5 and a second pole plate 62 are formed at the same time by one patterning process (including film formation, exposure, development, and wet etching or dry etching).

Wherein, the gate insulating layer 4 may be a single layer formed of a silicon oxide material or a silicon nitride material, or a lamination layer formed of the silicon oxide material and the silicon nitride material. A thickness of the gate insulating layer 4 is in a range of 500 Å-2000 Å, preferably in a range of 600 Å-1500 Å, or an appropriate thickness selected according to a practical process requirement. The first metal layer is formed of a metal or metal alloy conductive material such as molybdenum, a molybdenum alloy. A thickness of the gate 5 and the second pole plate 62 is in a range of 1000 Å-8000 Å, preferably in a range of 2500 Å-4000 Å.

Figure 2F:
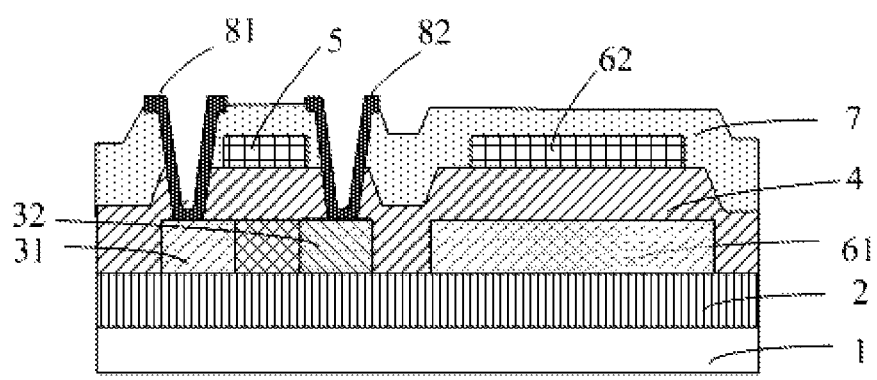

In order to insulatively protect of the thin film transistor and the storage capacitor as well as extract a signal from them/introduce a signal into them, as shown in FIG. 2F, the method for manufacturing an array substrate further includes the following steps: step S15: forming an interlayer insulating layer 7 and a pattern including an extraction electrode on the substrate on which the thin film transistor and the storage capacitor are formed, so that the extraction electrode includes a first electrode 81 and a second electrode 82, regions of the interlayer insulating layer 7 which correspond to the source 31 and the drain 32 are respectively provided with a first via and a second via, the source 31 is electrically connected to the first electrode 81 through the first via, and the drain 32 is electrically connected to the second electrode 82 through the second via.

Wherein, the interlayer insulating layer 7 is formed on the thin film transistor and the storage capacitor, to insulatively protect the thin film transistor and the storage capacitor. The extraction electrodes are formed in the regions of the interlayer insulating layer 7 which correspond to the source 31 and the drain 32, to extract a signal from the thin film transistor and introduce a signal into the thin film transistor.

Specifically, the step is as follows: forming the interlayer insulating layer 7 on the thin film transistor and the storage capacitor by using plasma enhanced chemical vapor deposition, low pressure chemical vapor deposition, atmospheric pressure chemical vapor deposition, or electron cyclotron resonance chemical vapor deposition, the deposition temperature thereof being less than or equal to 600° C.; next, forming a photoresist mask on the interlayer insulating layer 7 by using a lithography process, and forming the first via and the second via by using a dry etching process. Wherein, in the dry etching process, a gas including a fluorine element or a chlorine element, such as $SF_6$, $CF_4$, $CHF_3$, $CCl_2F_2$, or a mixed gas of the previous gas and $O_2$ may be used as an etching medium. Etching is performed by using a reactive ion etching method, a plasma etching method, or an inductively coupled plasma etching method.

Then, a second metal layer is formed on the interlayer insulating layer 7 by using sputtering, thermal evaporation, plasma enhanced chemical vapor deposition, low pressure chemical vapor deposition, atmospheric pressure chemical vapor deposition, or electron cyclotron resonance chemical vapor deposition. A photoresist mask is formed on the second metal layer with a photoresist by a lithography process, and a pattern including the first electrode 81 and the second electrode 82 is formed by wet etching or dry etching, so that the first electrode 81 penetrates through the first via and is electrically connected to the source 31, and the second electrode 82 penetrates through the second via and is electrically connected to the drain 32.

Wherein, the interlayer insulating layer 7 is a single layer formed of a silicon nitride material or a silicon oxide material, or a lamination layer formed of the silicon nitride material and the silicon oxide material. A thickness of the interlayer insulating layer 7 is in a range of 3000 Å-9000 Å, preferably in a range of 4000 Å-6000 Å. The second metal layer is formed of a metal or metal alloy conductive material such as molybdenum, a molybdenum alloy, aluminum, an aluminum alloy, titanium, and the thickness thereof is in a range of 1000 Å-8000 Å, preferably in a range of 2500 Å-4000 Å.

So far, the thin film transistor including the gate, the source, and the drain as well as the storage capacitor including the first pole plate (a lower pole plate) and the second pole plate (an upper pole plate) in an array substrate have been manufactured by the manufacturing method. A display panel is finally formed according to the structural requirement of the array substrate by a traditional process, and a display device may be further formed.

In the present embodiment, in the array substrate formed by the above method for manufacturing an array substrate, the thin film transistor is of top-gate type, and the detailed structure of the array substrate is as follows:

A buffer layer 2 is arranged on a substrate 1, and a source 31, a drain 32, and a first pole plate 61 are arranged in a single layer on the buffer layer 2. A gate insulating layer 4 is formed on the source 31, the drain 32, and the first pole plate 61, and fully covers the source 31, the drain 32, and the first pole plate 61. A gate 5 is formed on the gate insulating layer 4 and above the source 31 and the drain 32, so that the gate 5 at least partially overlaps both the source 31 and the drain 32 in an orthogonal projection direction. A second pole plate 62 is formed above the first pole plate 61, so that the second pole plate 62 at least partially overlaps the first pole plate 61 in the orthogonal projection direction.

Meanwhile, in order to insulatively protect the thin film transistor and the storage capacitor as well as extract a signal from them, the array substrate further includes an interlayer insulating layer 7 and extraction electrodes. The extraction electrodes include a first electrode 81 and a second electrode 82. The interlayer insulating layer 7 is arranged on the thin film transistor and the storage capacitor. The interlayer insulating layer 7 is provided with a first via and a second via at regions which correspond to the source 31 and the drain 32. The source 31 is electrically connected to the first electrode 81 through the first via, and the drain 32 is electrically connected to the second electrode 82 through the second via. Furthermore, the first electrode 81 is electrically connected to a data line in the array substrate, and the second electrode 82 is electrically connected to a pixel electrode in the array substrate.

Embodiment 2

Figure 3:
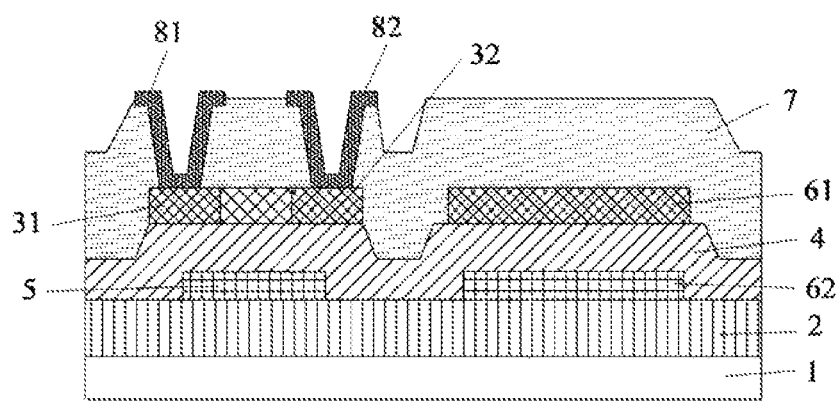
FIG. 3 is a sectional view of the array substrate being manufactured by using the method for manufacturing an array substrate according to Embodiment 2 of the present invention.

The present embodiment differs from Embodiment 1 in that, the thin film transistor in the array substrate according to the present embodiment has a bottom-gate type structure, and a sectional view showing the array substrate formed by using the method for manufacturing an array substrate according to Embodiment 2 is shown in FIG. 3. In the present embodiment, the method for manufacturing an array substrate specifically includes the following steps:

Step S20: forming a buffer layer 2 on the substrate.

Step S21: forming a pattern including the gate 5, the second pole plate 62, and a gate insulating layer 4 on the buffer layer.

Step S22: forming the amorphous silicon layer on the substrate subjected to step S21, and performing a patterning process on the amorphous silicon layer to form a pattern including an amorphous silicon island.

Step S23: on the substrate subjected to the step S22, forming a photoresist mask by using a photoresist, setting a to-be-doped region in the amorphous silicon island, and implanting the dopant ions into the to-be-doped region by the one ion-implantation process. Wherein, the to-be-doped region includes a source region to be formed into the source 31, a drain region to be formed into the drain 32, and a pole plate region to be formed into the first pole plate 61. The gate 5 at least partially overlaps the source 31 and the drain 32 in an orthogonal projection direction, and the second pole plate 62 at least partially overlaps the first pole plate 61 in the orthogonal projection direction.

Step S24: on the substrate subjected to the step S23, irradiating the amorphous silicon island by the laser irradiation process to convert the amorphous silicon island into a polysilicon island and activate the dopant ions in the source 31, the drain 32, and the first pole plate 61.

In the present embodiment, in manufacturing the array substrate, the following steps are the same with those of Embodiment 1 and thus description thereof is omitted: forming a photoresist mask by using a photoresist, setting a to-be-doped region in the amorphous silicon island, and implanting dopant ions into the to-be-doped region by one ion-implantation process, as well as irradiating the amorphous silicon island by the laser irradiation process to convert the amorphous silicon island into a polysilicon island and activate the dopant ions in the source 31, the drain 32, and the first pole plate 61.

Embodiment 3

The present embodiment provides a display device including the array substrate according to Embodiment 1 or 2.

The display device may be any product or component having a display function, such as a liquid crystal panel, electronic paper, an OLED panel, a mobile phone, a tablet computer, a television set, a monitor, a notebook computer, a digital picture frame, a navigator.

In the embodiments of the present invention, the source, the drain, and the first pole plate are formed by one ion-implantation process. Thus, one ion-implantation process is saved, the process time is shortened, and the production cost is reduced. Furthermore, an excimer laser apparatus is directly used to perform two times of excimer laser irradiation, which plays the roles of crystallizing an amorphous silicon material (the first laser irradiation treatment) and activating dopant ions (the second laser irradiation treatment) at the same time. Thus, a long heating process and a long cooling process are not required, and a cost for process equipment is reduced. Furthermore, the second laser irradiation treatment also plays the role of melting and recrystallizing polysilicon, increasing the crystallite dimension. Thus, carrier mobility of a polysilicon thin film transistor is increased largely, so that a drive capability of the thin film transistor is increased, a volume thereof can be further reduced, facilitating manufacturing a display panel with high resolution.

Briefly, the optimized method for manufacturing an array substrate of low-temperature polysilicon thin film transistor according to the present invention can simplify process steps and reduce the process cost greatly, and increase the performance of the array substrate and the performance of the display device including the array substrate at the same time, through optimization by using an excimer laser annealing process, an ion-implantation process and an excimer laser activation process for dopant ions.

It should be understood that, the foregoing embodiments are only exemplary embodiments used to explain the principle of the present invention, and the present invention is not limited thereto. Variations and improvements may be easily conceived by a person having ordinary skill in the art without departing from the spirit and essence of the present invention, and these variations and improvements also fall within the protection scope of the present invention.

What is claimed is:

1. A method for manufacturing an array substrate, including a step of forming a thin film transistor and a storage capacitor on a substrate, the thin film transistor including a gate, a source, and a drain, and the storage capacitor including a first pole plate and a second pole plate, wherein, arranging the source, the drain, and the first pole plate in a single layer firstly through implanting dopant ions into an amorphous silicon layer formed on the substrate by one ion-implantation process, and then through crystallizing an amorphous silicon material forming the amorphous silicon layer and activating the dopant ions by a laser irradiation process.

2. The method according to claim 1, wherein, the step of forming a thin film transistor and a storage capacitor on a substrate includes the following steps:

step S10: forming a buffer layer on the substrate;

step S11: forming the amorphous silicon layer on the buffer layer, and performing a patterning process on the amorphous silicon layer to form a pattern including an amorphous silicon island;

step S12: on the substrate subjected to the step S11, forming a photoresist mask by using a photoresist, setting a to-be-doped region in the amorphous silicon island, and implanting the dopant ions into the to-be-doped region by the one ion-implantation process, wherein, the to-be-doped region includes a source region to be formed into the source, a drain region to be formed into the drain, and a pole plate region to be formed into the first pole plate;

step S13: on the substrate subjected to the step S12, irradiating the amorphous silicon island by the laser irradiation process to convert the amorphous silicon island into a polysilicon island and activate the dopant ions in the source, the drain, and the first pole plate; and step S14: on the substrate subjected to the step S13, forming a pattern including a gate insulating layer, the gate, and the second pole plate, so that the gate at least partially overlaps the source and the drain in an orthogonal projection direction, and the second pole plate at least partially overlaps the first pole plate in the orthogonal projection direction.

3. The method according to claim 2, wherein, the step of forming a photoresist mask by using a photoresist, setting a to-be-doped region in the amorphous silicon island, and implanting the dopant ions into the to-be-doped region by the one ion-implantation process include the following steps:

step S30: forming a layer of photoresist on the substrate on which the pattern including the amorphous silicon island is formed;

step S31: exposing the photoresist by using a mask plate and developing the photoresist, so that portions of the photoresist which correspond to the source region, the drain region, and the pole plate region are removed completely, and other portion of the photoresist is reserved completely;

step S32: implanting the dopant ions into the source region, the drain region, and the pole plate region by the one ion-implantation process; and step S33: stripping off remaining photoresist.

4. The method according to claim 2, wherein, the laser irradiation process is an excimer laser process, the laser irradiation process includes two laser irradiation treatments, a first laser irradiation treatment causes the amorphous silicon island to be crystallized and converted into a polysilicon island, a second laser irradiation treatment actives the dopant ions implanted into the polysilicon island by the ion-implantation process to active the dopant ions in the source, the drain, and the first pole plate.

5. The method according to claim 4, wherein, a laser used in the excimer laser process includes an ArF laser, a KrF laser, or an XeCl laser, the ArF laser has a wavelength of 193 nm, the KrF laser has a wavelength of 248 nm, and the XeCl laser has a wavelength of 308 nm, and the ArF laser, the KrF laser, and the XeCl laser have a pulse width range of 10-50 ns.

6. The method according to claim 2, further including the following step:

forming an interlayer insulating layer and a pattern including an extraction electrode on the substrate on which the thin film transistor and the storage capacitor are formed, so that the extraction electrode includes a first electrode and a second electrode, the interlayer insulating layer are provided with a first via and a second via at regions which correspond to the source and the drain respectively, the source is electrically connected to the first electrode through the first via, and the drain is electrically connected to the second electrode through the second via.

7. The method according to claim 1, wherein, the step of forming a thin film transistor and a storage capacitor on a substrate includes the following steps:

step S20: forming a buffer layer on the substrate;

step S21: forming a pattern including the gate, the second pole plate, and a gate insulating layer on the buffer layer;

step S22: forming the amorphous silicon layer on the substrate subjected to the step S21, and performing a patterning process on the amorphous silicon layer to form a pattern including an amorphous silicon island;

step S23: on the substrate subjected to the step S22, forming a photoresist mask by using a photoresist, setting a to-be-doped region in the amorphous silicon island, and implanting the dopant ions into the to-be-doped region by the one ion-implantation process, wherein, the to-be-doped region includes a source region to be formed into the source, a drain region to be formed into the drain, and a pole plate region to be formed into the first pole plate, the gate at least partially overlaps the source and the drain in an orthogonal projection direction, and the second pole plate at least partially overlaps the first pole plate in the orthogonal projection direction; and step S24: on the substrate subjected to the step S23, irradiating the amorphous silicon island by the laser irradiation process to convert the amorphous silicon island into a polysilicon island and activate the dopant ions in the source, the drain, and the first pole plate.

8. The method according to claim 7, wherein, the step of forming a photoresist mask by using a photoresist, setting a to-be-doped region in the amorphous silicon island, and implanting the dopant ions into the to-be-doped region by the one ion-implantation process include the following steps:

step S30: forming a layer of photoresist on the substrate on which the pattern including the amorphous silicon island is formed;

step S31: exposing the photoresist by using a mask plate and developing the photoresist, so that portions of the photoresist which correspond to the source region, the drain region, and the pole plate region are removed completely, and other portion of the photoresist is reserved completely;

step S32: implanting the dopant ions into the source region, the drain region, and the pole plate region by the one ion-implantation process; and step S33: stripping off remaining photoresist.

9. The method according to claim 7, wherein, the laser irradiation process is an excimer laser process, the laser irradiation process includes two laser irradiation treatments, a first laser irradiation treatment causes the amorphous silicon island to be crystallized and converted into a polysilicon island, a second laser irradiation treatment actives the dopant ions implanted into the polysilicon island by the ion-implantation process to active the dopant ions in the source, the drain, and the first pole plate.

10. The method according to claim 9, wherein, a laser used in the excimer laser process includes an ArF laser, a KrF laser, or an XeCl laser, the ArF laser has a wavelength of 193 nm, the KrF laser has a wavelength of 248 nm, and the XeCl laser has a wavelength of 308 nm, and the ArF laser, the KrF laser, and the XeCl laser have a pulse width range of 10-50 ns.

11. The method according to claim 7, further including the following step:

forming an interlayer insulating layer and a pattern including an extraction electrode on the substrate on which the thin film transistor and the storage capacitor are formed, so that the extraction electrode includes a first electrode and a second electrode, the interlayer insulating layer are provided with a first via and a second via at regions which correspond to the source and the drain respectively, the source is electrically connected to the first electrode through the first via, and the drain is electrically connected to the second electrode through the second via.

12. The method according to claim 1, wherein, the ion-implantation process includes an ion-implantation process with a mass analyzer, an ion cloud type implantation process without a mass analyzer, a plasma implantation process, or a solid-state diffusion implantation process, wherein, an implantation medium is a gas including a boron element and/or a phosphorus element, an implantation energy is in a range of 10-200 keV, and an implantation dose is in a range of $1\times10^{11}$-$1\times10^{20}$ atoms/cm$^3$.

* * * * *